United States Patent
Taniguchi

(10) Patent No.: US 10,468,584 B2
(45) Date of Patent: Nov. 5, 2019

(54) SURFACE ACOUSTIC WAVE DEVICE AND DUPLEXER HAVING TRANSMISSION/RECEPTION FILTER USING SAME

(71) Applicant: Murata Manufacturing Co., Ltd., Nagaokakyo-shi, Kyoto-fu (JP)

(72) Inventor: Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 464 days.

(21) Appl. No.: 15/413,557

(22) Filed: Jan. 24, 2017

(65) Prior Publication Data
US 2017/0250335 A1    Aug. 31, 2017

(30) Foreign Application Priority Data
Feb. 29, 2016  (JP) ................. 2016-037613

(51) Int. Cl.
*H03H 9/25* (2006.01)
*H01L 41/047* (2006.01)
*H01L 41/053* (2006.01)
*H03H 9/72* (2006.01)
*H03H 9/145* (2006.01)

(52) U.S. Cl.
CPC ...... *H01L 41/0477* (2013.01); *H01L 41/0533* (2013.01); *H03H 9/14541* (2013.01); *H03H 9/725* (2013.01)

(58) Field of Classification Search
CPC ............ H01L 41/0477; H01L 41/0533; H03H 9/14541; H03H 9/725

USPC .............. 310/313 R, 313 B, 313 D, 363, 364
See application file for complete search history.

(56) References Cited

U.S. PATENT DOCUMENTS

| | | | |
|---|---|---|---|
| 2007/0176711 A1* | 8/2007 | Kando ................ | H03H 9/0222 333/193 |
| 2008/0012450 A1 | 1/2008 | Meister et al. | |
| 2009/0121584 A1* | 5/2009 | Nishimura ......... | H03H 9/02834 310/313 B |
| 2012/0187799 A1* | 7/2012 | Nakahashi .......... | H03H 9/0071 310/313 A |
| 2013/0285504 A1* | 10/2013 | Tamasaki .......... | H03H 9/02574 310/313 C |
| 2018/0041187 A1* | 2/2018 | Yashiro ............. | H03H 9/02574 |

FOREIGN PATENT DOCUMENTS

| | | |
|---|---|---|
| JP | 2002-026685 A | 1/2002 |
| JP | 2007-235711 A | 9/2007 |
| JP | 4043045 B2 | 2/2008 |
| JP | 2008-522514 A | 6/2008 |

* cited by examiner

*Primary Examiner* — Thomas M Dougherty
(74) *Attorney, Agent, or Firm* — Keating & Bennett, LLP

(57) ABSTRACT

A surface acoustic wave device includes a piezoelectric substrate and an IDT electrode on the piezoelectric substrate. The IDT electrode includes a main electrode layer and a barrier layer between the piezoelectric substrate and the main electrode layer. The main electrode layer is inside a region in which the barrier layer is provided in plan view to suppress diffusion between the piezoelectric substrate and the main electrode layer when a voltage is applied to the IDT electrode.

21 Claims, 4 Drawing Sheets

SURFACE ACOUSTIC WAVE DEVICE AND DUPLEXER HAVING TRANSMISSION/RECEPTION FILTER USING SAME

CROSS REFERENCE TO RELATED APPLICATIONS

This application claims the benefit of priority to Japanese Patent Application No. 2016-037613 filed on Feb. 29, 2016. The entire contents of this application are hereby incorporated herein by reference.

BACKGROUND OF THE INVENTION

1. Field of the Invention

The present invention relates to a surface acoustic wave device that is used as a resonator or a bandpass filter and to a duplexer including a transmission/reception filter that includes a surface acoustic wave device.

2. Description of the Related Art

To date, surface acoustic wave devices have been widely used as resonators and bandpass filters. Such surface acoustic wave devices typically include a comb-shaped interdigital transducer (IDT) electrode formed on the surface of a substrate having a piezoelectric property.

The operation frequency of surface acoustic wave devices has been shifting toward higher frequencies from a band of several hundred MHz to a band of several GHz in conjunction with the shift toward higher frequencies and the continuing size reduction of mobile communication devices, and together with this, high-frequency devices such as bandpass filters that use surface acoustic wave devices have been becoming progressively smaller in size. The pattern width of an IDT electrode needs to be very small in order to realize a high frequency and an IDT electrode needs to be formed with a pattern width of around 0.50 µm in a high-frequency bandpass filter having a center frequency of 2 GHz, for example.

As disclosed in Japanese Unexamined Patent Application Publication No. 2002-26685, an IDT electrode experiences a strong stress from a surface acoustic wave propagating along the surface of a piezoelectric substrate when a high-level voltage is applied to an IDT electrode having a very small pattern width as described above. If this stress exceeds the critical stress of the electrode film, stress-induced electrochemical migration occurs. In the case where Al is used as the material of the IDT electrode, Al atoms move along the crystalline grain boundaries due to the stress-induced electrochemical migration, and consequently, hillocks and voids are generated in the IDT electrode. Therefore, the IDT electrode is damaged and a point is reached where the characteristics of the surface acoustic wave device are degraded such that increases in electrical short circuits and insertion loss, and lowering of the Q value of a resonator occur.

In order to solve the above-described problem, a proposal has been made to use Cu as the material of the IDT electrode. As disclosed in Japanese Unexamined Patent Application Publication Nos. 2002-26685 and 2007-235711, there is a problem regarding adhesion between an IDT electrode formed of Cu and a piezoelectric substrate. Therefore, an adhesive layer is provided between a main electrode layer and the piezoelectric substrate, and as a result, the adhesion and electric power handling capability of the IDT electrode can be improved. For example, one metal material selected from a group consisting of Ti, Ni, Cr and Ni—Cr is used as the material of the adhesive layer.

However, it has been recognized that, even in the case of a surface acoustic wave device in which an adhesive layer is provided between the main electrode layer and the piezoelectric substrate, the insertion loss of a bandpass filter increases when a high-level voltage is applied for a long time in a high-temperature environment to a bandpass filter in which such a surface acoustic wave device is used.

Consequently, adding a surface acoustic wave device to a terminal section of the bandpass filter, adding a direct-current cutting capacitor outside the bandpass filter and so forth in order to reduce the voltage applied to the bandpass filter have been considered, but this would cause the size of the product to be increased in such cases.

It is thought that the increase in the insertion loss of the bandpass filter described above is caused by the metal that forms the main electrode layer of the IDT electrode diffusing into the piezoelectric substrate. The metal that forms the main electrode layer fuses with the crystal that forms the piezoelectric substrate and causes electrical short circuiting of the IDT electrode to occur. Such an increase in insertion loss cannot be sufficiently suppressed even when an adhesive layer formed of a material that does not readily diffuse into the piezoelectric substrate is provided between the main electrode layer and the piezoelectric substrate.

SUMMARY OF THE INVENTION

Preferred embodiments of the present invention provide a surface acoustic wave device that significantly reduces or prevents diffusion between a main electrode layer of an IDT electrode and a piezoelectric substrate when a high-level voltage is applied to the IDT electrode, that has high reliability and excellent frequency characteristics and that realizes a reduction in size, and also provide a duplexer including a transmission/reception filter that includes the surface acoustic wave device.

A surface acoustic wave device according to a preferred embodiment of the present invention includes a piezoelectric substrate and an IDT electrode on the piezoelectric substrate. The IDT electrode includes a first conductor layer and a second conductor layer that between the piezoelectric substrate and the first conductor layer. The first conductor layer is inside a region in which the second conductor layer is provided in plan view so as to suppress diffusion between the piezoelectric substrate and the first conductor layer when a voltage is applied to the IDT electrode.

In a surface acoustic wave device according to a preferred embodiment of the present invention, the piezoelectric substrate may include $LiNbO_3$, the first conductor layer may include Cu or a metal alloy including Cu, and the second conductor layer may include one metal selected from a group consisting of Ni—Cr, Ni and Cr. Cu or a metal alloy including Cu does not readily diffuse into the piezoelectric substrate including $LiNbO_3$. Therefore, it is particularly effective to provide the second conductor layer including a material that does not readily diffuse into the piezoelectric substrate between the first conductor layer and the piezoelectric substrate and provide the first conductor layer inside the region in which the second conductor layer is provided.

In a surface acoustic wave device according to a preferred embodiment of the present invention, the IDT electrode may include first electrode fingers and second electrode fingers that are adjacent to the first electrode fingers, and a relation $0.01L \leq R < 0.5W$ is preferably satisfied, where R is a width between an edge of the first conductor layer and an edge of the second conductor layer, L is a width of each first electrode finger and W is a spacing between each first electrode finger and the adjacent second electrode fingers. The terms "width" and "spacing" in the present specification refer to dimensions in a propagation direction of a surface acoustic wave in a plan view of the surface acoustic wave device.

In a surface acoustic wave device according to a preferred embodiment of the present invention, a relation 10 nm≤R<500 nm is preferably satisfied, where R represents a width between an edge of the first conductor layer and an edge of the second conductor layer.

A surface acoustic wave device according to a preferred embodiment of the present invention may further include a third conductor layer that is disposed between the first conductor layer and the second conductor layer, the third conductor layer being made of a metal not including Cu or a metal alloy that does not include Cu.

A surface acoustic wave device according to a preferred embodiment of the present invention may further include a third conductor layer that is disposed between the first conductor layer and the second conductor layer, the third conductor layer including one metal selected from a group consisting of Pt, Au, Ag, Ta, W, Ni and Mo or a metal alloy including at least two of these metals.

A surface acoustic wave device according to a preferred embodiment of the present invention may further include an insulating layer that covers the IDT electrode.

A duplexer according to a preferred embodiment of the present invention includes a transmission-side filter that includes a transmission-side terminal, and a reception-side filter that includes a reception-side terminal, and one of the surface acoustic wave devices according to a preferred embodiment of the present invention described above is connected in parallel with an initial stage of the transmission-side terminal.

A duplexer according to a preferred embodiment of the present invention includes a transmission-side filter that includes a transmission-side terminal, and a reception-side filter that includes a reception-side terminal, where a surface acoustic wave device unit in which the surface acoustic wave devices according to the preferred embodiments of the present invention described above are longitudinally coupled with each other is connected to an initial stage of the reception-side terminal.

In a surface acoustic wave device according to a preferred embodiment of the present invention, diffusion between the main electrode layer of the IDT electrode and the piezoelectric substrate is sufficiently reduced or prevented even when a high-level voltage is applied to the IDT electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, surface acoustic wave device and duplexers including transmission/reception filters that include surface acoustic wave devices according to preferred embodiments of the present invention will be described as illustrative preferred embodiments. The present invention is not limited to just the following preferred embodiments. In addition, the drawings are to facilitate understanding of the present invention and the scale, etc. of the drawings are different from what they would be in reality.

First Preferred Embodiment

Figure 1:
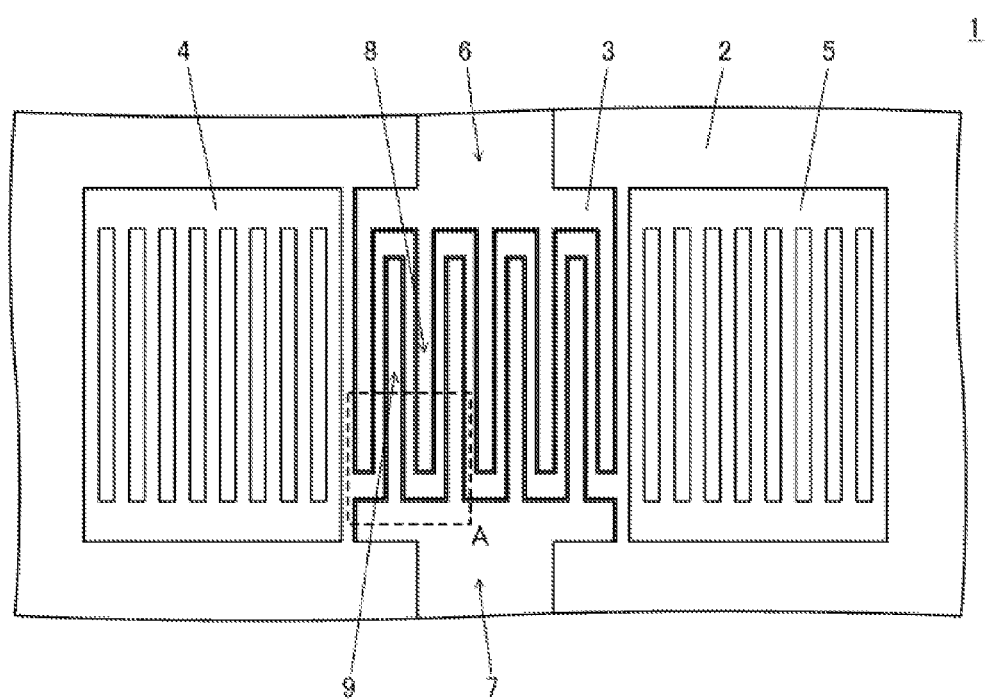
FIG. 1 is a schematic plan view of an IDT electrode of a surface acoustic wave device according to a preferred embodiment of the present invention.
Figure 2:
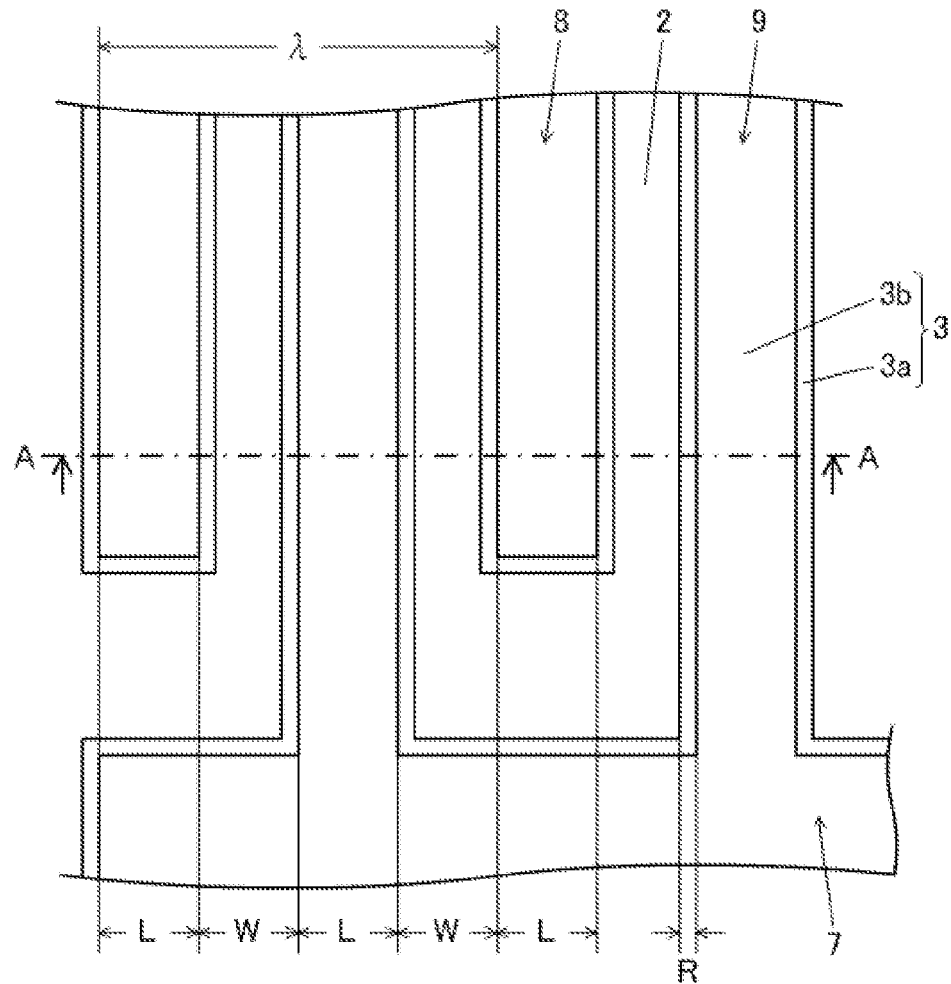
FIG. 2 is a partial schematic plan view illustrating a portion of the IDT electrode of FIG. 1 in an enlarged manner.
Figure 3:
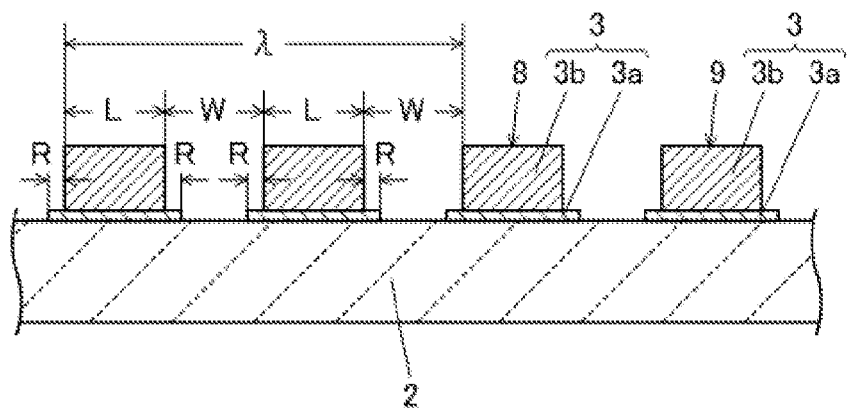
FIG. 3 is a schematic sectional view illustrating a cross section taken along line A-A of FIG. 2.

A surface acoustic wave device according to a first preferred embodiment of the present invention will be described while referring to FIGS. 1 to 3. FIG. 1 is a schematic plan view of an IDT electrode of the surface acoustic wave device according to the first preferred embodiment of the present invention. FIG. 2 is a partial schematic plan view illustrating a portion of the IDT electrode of FIG. 1 in an enlarged manner. FIG. 3 is a schematic sectional view of FIG. 2 and illustrates a cross section taken along line A-A of FIG. 2.

A surface acoustic wave device 1 according to the first preferred embodiment includes a piezoelectric substrate 2, an IDT electrode 3 that is provided on the piezoelectric substrate 2, and reflectors 4 and 5 that are arranged on either side of the IDT electrode 3 in the propagation direction of a surface acoustic wave.

The IDT electrode 3 includes a pair of common electrodes 6 and 7, which face each other, and a plurality of electrode fingers 8 and 9. The bases of the plurality of electrode fingers 8 and 9 are connected to the common electrodes 6 and 7, respectively, in an alternating manner in the propagation direction of a surface acoustic wave. That is, the electrode fingers 8 are connected to the common electrode 6 and the electrode fingers 9, which are adjacent to the electrode fingers 8, are connected to the common electrode 7.

A period λ of the electrode fingers connected to one common electrode is determined by the wavelength of a surface acoustic wave. A width L of a main electrode layer of the electrode fingers 8 and 9 and a spacing W between an electrode finger 8 and an adjacent electrode finger 9 are set in consideration of the desired frequency characteristics.

The IDT electrode 3 is formed preferably by stacking a plurality of conductor layers on top of one another and a barrier layer (second conductor layer) 3a is formed between the piezoelectric substrate 2 and a main electrode layer (first conductor layer) 3b. As illustrated in FIG. 2, there is a width R between an edge of the barrier layer 3a and an edge of the main electrode layer 3b. In other words, in a plan view of the surface acoustic wave device 1, the main electrode layer 3b is located inside a region in which the barrier layer 3a is provided. The barrier layer 3a preferably has a smaller film thickness than the main electrode layer 3b. The reflectors 4 and 5, the common electrodes 6 and 7 and the electrode fingers 8 and 9 preferably have the same multilayer structures of conductor layers as each other.

In a non-limiting example of the surface acoustic wave device 1 according to the first preferred embodiment, the piezoelectric substrate 2 was formed of $LiNbO_3$, the main electrode layer 3b was formed of Cu and the barrier layer 3a was formed of Ni—Cr, for example. Assuming the frequency band was UMTS-BAND8, $\lambda$=4.0 μm, L=1.0 μm and W=1.0 μm, for example. In addition, the film thickness of the barrier layer 3a=30 nm, the film thickness of the main electrode layer 3b=300 nm and the width R between the edge of the barrier layer 3a and the edge of the main electrode layer 3b=10 nm, for example.

COMPARATIVE EXAMPLE

Next, in order to verify the effect of the barrier layer 3a having the width R, a surface acoustic wave device was manufactured that was formed to be the same as that of the first preferred embodiment except that the barrier layer 3a was not provided with the width R. That is, $\lambda$=4.0 μm, L=1.0 μm and W=1.0 μm, film thickness of barrier layer 3a=30 nm and film thickness of main electrode layer 3b=300 nm.

The reliabilities of surface acoustic wave device according to the first preferred embodiment of the present invention and of the surface acoustic wave device according to the comparative example were evaluated as follows. First, a bandpass filter was manufactured in which a plurality of the surface acoustic wave devices according to the first preferred embodiment were arranged in a ladder configuration. A bandpass filter was similarly manufactured using the surface acoustic wave devices according to the comparative example.

Next, a direct-current voltage (3-6 V) was applied in an environment of a high temperature load (85-125° C.) and the attenuation of the bandpass filters was measured at prescribed time intervals. In the obtained results, an increase in insertion loss was seen with the application of a voltage for around 1000 hours in the bandpass filter using the surface acoustic wave devices according to the comparative example, whereas no increase in insertion loss was seen in the bandpass filter using the surface acoustic wave devices according to the first preferred embodiment of the present invention.

Second Preferred Embodiment

In a non-limiting example of a surface acoustic wave device according to a second preferred embodiment of the present invention, the piezoelectric substrate 2 was formed of $LiNbO_3$, the main electrode layer 3b was formed of Cu and the barrier layer 3a was formed of Ni—Cr, for example. Assuming the frequency band was UMTS-BAND2, $\lambda$=2.0 μm, L=0.50 μm and W=0.50 μm, for example. In addition, the film thickness of the barrier layer 3a=30 nm, the film thickness of the main electrode layer 3b=162 nm and the width R between the edge of the barrier layer 3a and the edge of the main electrode layer 3b=22 nm, for example.

COMPARATIVE EXAMPLE

For comparison, a surface acoustic wave device was manufactured that was formed to be the same as that of the second preferred embodiment except that the barrier layer 3a was not provided with the width R. That is, $\lambda$=2.0 μm, L=0.50 μm and W=0.50 μm, the film thickness of the barrier layer 3a=30 nm and the film thickness of the main electrode layer 3b=162 nm.

The reliabilities of surface acoustic wave device according to the second preferred embodiment and of the surface acoustic wave device according to the comparative example were evaluated in the same way as for the first preferred embodiment. In the obtained results, an increase in insertion loss was seen in the bandpass filter using the surface acoustic wave devices according to the comparative example, whereas no increase in insertion loss was seen in the bandpass filter using the surface acoustic wave devices according to the second preferred embodiment of the present invention.

Therefore, it is clear that the barrier layer 3a, which has the width R, suppressed diffusion of the metal forming the main electrode layer 3b of the IDT electrode 3 into the crystal of the piezoelectric substrate 2 and that the reliability in an environment of a high temperature load was effectively improved. As a result of the main electrode layer 3b being provided inside the region in which the barrier layer 3a is provided in plan view, diffusion of material of a skirt portion of the main electrode layer 3b of the IDT electrode 3 at the boundary with the barrier layer 3a into the material forming the piezoelectric substrate 2 when a voltage is applied to the IDT electrode 3 is able to be significantly reduced or prevented.

The size of the width R between the edge of the barrier layer 3a and edge of the main electrode layer 3b is able to be decided upon by considering variations in the diffusion suppression action and a process of forming the conductor layers. Specifically, it is preferable that the width R be of a size equal to or more than about 1.0% of the width L of the main electrode layer 3b of the electrode finger 8 and such that the barrier layer 3a does not contact the barrier layers 3a of the adjacent electrode fingers 9. As a result of making the width R be of such a size that the barrier layer 3a does not contact the barrier layers 3a of the adjacent electrode fingers 9, the distance between the electrode fingers becomes smaller and therefore the electrostatic capacitance of the IDT electrode 3 itself can be increased. Therefore, when the same electrostatic capacitance is to be realized, the number of electrode fingers 8 and 9 is able to be relatively reduced or the cross width of the electrode fingers 8 and 9 is able to be relatively reduced, and consequently a reduction in the size of the IDT electrode 3 is able to be achieved.

It was confirmed that the skirt portion of the main electrode layer 3b sometimes expands and contacts the piezoelectric substrate 2 in the surface acoustic wave device 1 according to the comparative example. This is caused by variations in the process of manufacturing the conductor layers and the skirt portion may spread so as to be around 10 nm wider than the designed dimension. Therefore, it is preferable that the width R be provided between the edge of the barrier layer 3a and the edge of the main electrode layer 3b also for the purpose of preventing such contact between the main electrode layer 3b and the piezoelectric substrate 2.

For example, a single crystal composed of $LiNbO_3$ or $LiTaO_3$ can be used as the material forming the piezoelectric substrate 2. It is preferable that the barrier layer 3a be formed of a material that does not readily diffuse into the material of the piezoelectric substrate 2, and for example, one metal selected from a group consisting of Ni—Cr, Ni and Cr can be used. For example, Cu or a metal alloy containing Cu such as Al—Cu can be used as the material forming the main electrode layer 3b.

Figure 4:
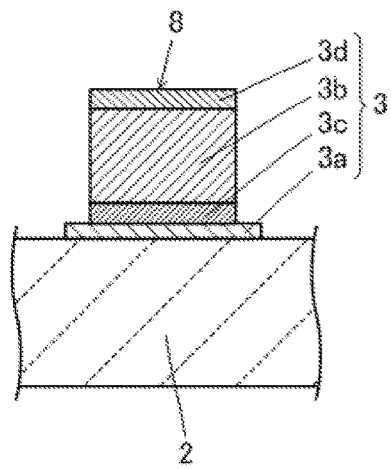
FIG. 4 is a schematic sectional view illustrating an IDT electrode in which a middle layer and a protective layer are provided.

As illustrated in FIG. 4, the main electrode layer 3b may be made of Cu and a layer made of a metal not including Cu or a metal alloy not containing Cu may be provided as a middle layer (third conductor layer) 3c between the main electrode layer 3b and the barrier layer 3a. Thus, diffusion of Cu is able to be reduced or prevented even more effectively. For example, one metal selected from a group consisting of Pt, Au, Ag, Ta, W, Ni and Mo or a metal alloy of any of these metals may be used as the material forming the middle layer 3c.

Furthermore, by forming a protective layer 3d composed of an Al—Cu alloy or the like on the main electrode layer 3b, both resistance to organic solvents and excellent electric power handling capability are able to be realized. The middle layer 3c and the protective layer 3d may both be provided or just one of the layers may be provided.

The conductor layers may be formed using a sputtering method or a vapor deposition method and may be patterned using a dry etching method, a wet etching method, a lift off method or using a combination of these methods, for example.

In the above-described preferred embodiments, the reflectors 4 and 5, the common electrodes 6 and 7 and the electrode fingers 8 and 9 preferably have the same multilayer structures of conductor layers as each other, but may instead have different conductor layer structures. For example, the reflectors 4 and 5 may have a structure in which the barrier layer 3a is not provided with the width R and may have a structure made up of a single conductor layer.

Figure 5:
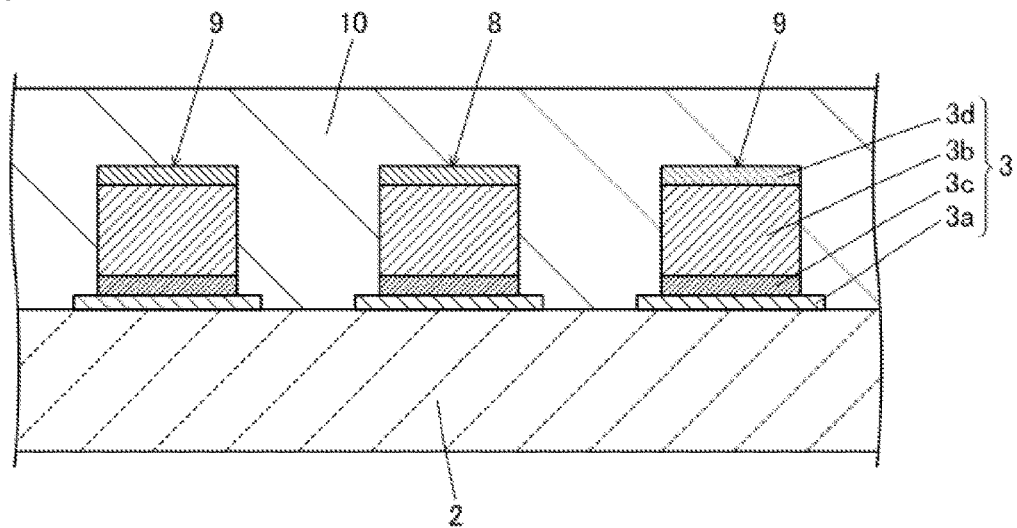
FIG. 5 is a schematic sectional view illustrating an IDT electrode equipped with an insulating layer provided so as to cover the IDT electrode.

As illustrated in FIG. 5, an insulating layer 10 may cover the IDT electrode 3. As a result of providing the insulating layer 10, the frequency-temperature characteristics are able to be improved with hardly any loss in electric power handling capability. The insulating layer 10 is preferably made of $SiO_2$, for example. The insulating layer 10 is not limited to being a single layer and may be a multilayer body including a plurality of insulating layers.

Figure 6:
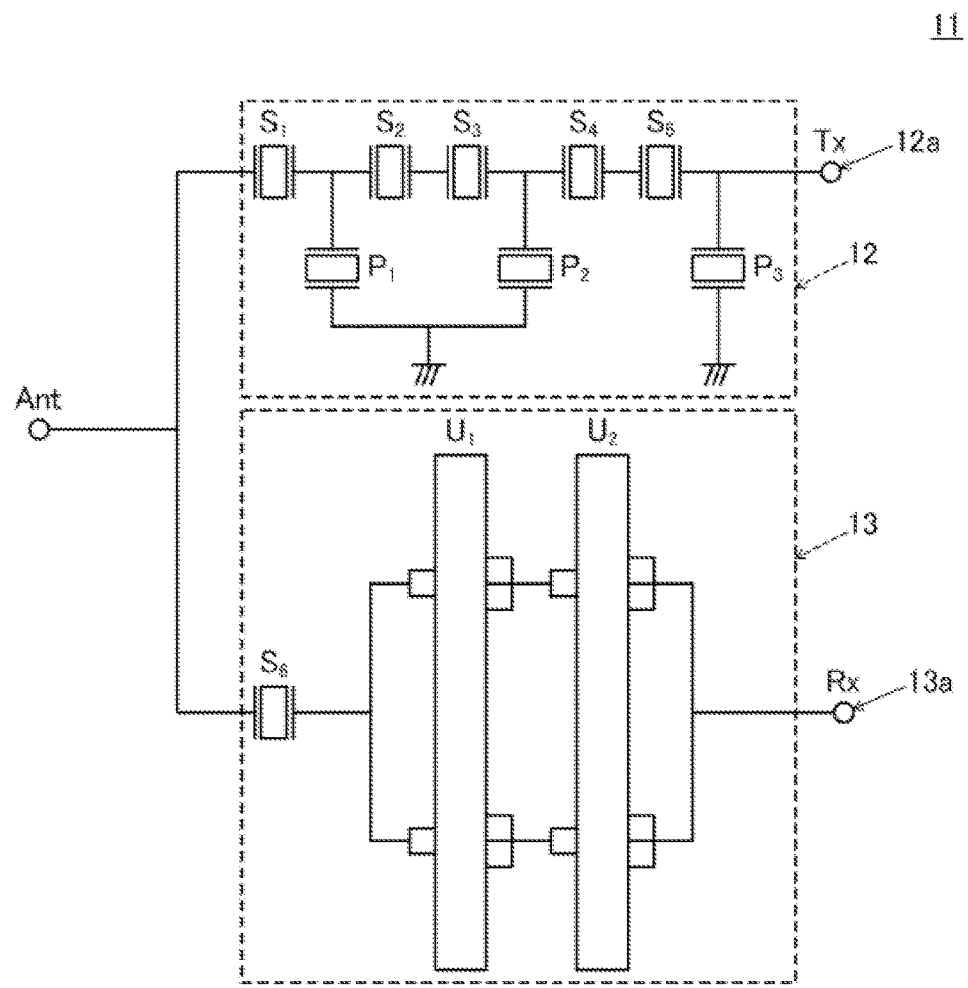
FIG. 6 is a schematic circuit diagram of a duplexer including transmission/reception filters that includes surface acoustic wave devices according to a preferred embodiment of the present invention.

FIG. 6 is a schematic circuit diagram of a duplexer 11 including transmission/reception filters that include surface acoustic wave devices according to a preferred embodiment of the present invention. A transmission-side bandpass filter 12 is provided by arranging a plurality of surface acoustic wave device S1 to S5 and P1 to P3 in a ladder configuration between a transmission-side terminal section 12a and an antenna terminal section. The surface acoustic wave device P3 is connected in parallel with an initial stage of the transmission-side terminal section 12a. A reception-side bandpass filter 13 is provided by cascade coupling surface acoustic wave device units U1 and U2, in each of which a plurality of surface acoustic wave devices are longitudinally coupled with each other, between a reception-side terminal section 13a and the antenna terminal section. The initial stage of the reception-side terminal section 13a is the longitudinally-coupled-type surface acoustic wave device unit U2.

A surface acoustic wave device according to a preferred embodiment of the present invention achieves improved electric power handling capability compared with a surface acoustic wave device of the related art. Consequently, a duplexer is able to be reduced in size without needing to connect elements to reduce an applied voltage in series with the transmission-side terminal section 12a and the reception-side terminal section 13a.

The present invention is not limited to the above-described preferred embodiments and various applications and modifications can be added so long as they do not depart from the gist of the present invention. In addition, the preferred embodiments described in the present specification are illustrative examples and it should be noted that portions or features of the configurations illustrated in different preferred embodiments can be substituted for one another or combined with one another.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a piezoelectric substrate; and
   an IDT electrode on the piezoelectric substrate; wherein
   the IDT electrode includes a first conductor layer, and a second conductor layer between the piezoelectric substrate and the first conductor layer; and
   the first conductor layer is inside a region in which the second conductor layer is provided in plan view to suppress diffusion between the piezoelectric substrate and the first conductor layer when a voltage is applied to the IDT electrode.

2. The surface acoustic wave device according to claim 1, wherein
   the piezoelectric substrate includes $LiNbO_3$;
   the first conductor layer includes Cu or a metal alloy including Cu; and
   the second conductor layer includes one metal selected from a group consisting of Ni—Cr, Ni and Cr.

3. The surface acoustic wave device according to claim 1, wherein the IDT electrode includes:
   first electrode fingers; and
   second electrode fingers that are adjacent to the first electrode fingers; and
   a relation $0.01L \leq R < 0.5W$ is satisfied, where R is a width between an edge of the first conductor layer and an edge of the second conductor layer, L is a width of each of the first electrode fingers and W is a spacing between each of the first electrode fingers and an adjacent one of the second electrode fingers.

4. The surface acoustic wave device according to claim 1, wherein a relation 10 nm$\leq$R<500 nm is satisfied, where R represents a width between an edge of the first conductor layer and an edge of the second conductor layer.

5. The surface acoustic wave device according to claim 3, further comprising:
   a third conductor layer between the first conductor layer and the second conductor layer; wherein
   the third conductor layer includes a metal other than Cu or a metal alloy that does not include Cu.

6. The surface acoustic wave device according to claim 3, further comprising:
   a third conductor layer between the first conductor layer and the second conductor layer; wherein
   the third conductor layer includes one metal selected from a group consisting of Pt, Au, Ag, Ta, W, Ni and Mo or a metal alloy including at least two of Pt, Au, Ag, Ta, W, Ni and Mo.

7. The surface acoustic wave device according to claim 1, further comprising:
   an insulating layer that covers the IDT electrode.

8. A duplexer comprising:
   a transmission-side filter that includes a transmission-side terminal; and
   a reception-side filter that includes a reception-side terminal; wherein the surface acoustic wave device according to claim 1 is connected in parallel with an initial stage of the transmission-side terminal.

9. The duplexer according to claim 8, wherein
the piezoelectric substrate includes LiNbO$_3$;
the first conductor layer includes Cu or a metal alloy including Cu; and
the second conductor layer includes one metal selected from a group consisting of Ni—Cr, Ni and Cr.

10. The duplexer according to claim 8, wherein the IDT electrode includes:
first electrode fingers; and
second electrode fingers that are adjacent to the first electrode fingers; and
a relation $0.01L \leq R < 0.5W$ is satisfied, where R is a width between an edge of the first conductor layer and an edge of the second conductor layer, L is a width of each of the first electrode fingers and W is a spacing between each of the first electrode fingers and an adjacent one of the second electrode fingers.

11. The duplexer according to claim 8, wherein a relation $10 \text{ nm} \leq R < 500 \text{ nm}$ is satisfied, where R represents a width between an edge of the first conductor layer and an edge of the second conductor layer.

12. The duplexer according to claim 10, wherein the surface acoustic wave device further comprises:
a third conductor layer between the first conductor layer and the second conductor layer; wherein
the third conductor layer includes a metal other than Cu or a metal alloy that does not include Cu.

13. The duplexer according to claim 10, wherein the surface acoustic wave device further comprises:
a third conductor layer between the first conductor layer and the second conductor layer; wherein
the third conductor layer includes one metal selected from a group consisting of Pt, Au, Ag, Ta, W, Ni and Mo or a metal alloy including at least two of Pt, Au, Ag, Ta, W, Ni and Mo.

14. The duplexer according to claim 8, further comprising:
an insulating layer that covers the IDT electrode.

15. A duplexer comprising:
a transmission-side filter that includes a transmission-side terminal; and
a reception-side filter that includes a reception-side terminal; wherein
a surface acoustic wave device unit in which a plurality of the surface acoustic wave device according to claim 1 are longitudinally coupled with each other is connected to an initial stage of the reception-side terminal.

16. The duplexer according to claim 15, wherein
the piezoelectric substrate includes LiNbO$_3$;
the first conductor layer includes Cu or a metal alloy including Cu; and
the second conductor layer includes one metal selected from a group consisting of Ni—Cr, Ni and Cr.

17. The duplexer according to claim 15, wherein the IDT electrode includes:
first electrode fingers; and
second electrode fingers that are adjacent to the first electrode fingers; and
a relation $0.01L \leq R < 0.5W$ is satisfied, where R is a width between an edge of the first conductor layer and an edge of the second conductor layer, L is a width of each of the first electrode fingers and W is a spacing between each of the first electrode fingers and an adjacent one of the second electrode fingers.

18. The duplexer according to claim 15, wherein a relation $10 \text{ nm} \leq R < 500 \text{ nm}$ is satisfied, where R represents a width between an edge of the first conductor layer and an edge of the second conductor layer.

19. The duplexer according to claim 17, wherein the surface acoustic wave device further comprises:
a third conductor layer between the first conductor layer and the second conductor layer; wherein
the third conductor layer includes a metal other than Cu or a metal alloy that does not include Cu.

20. The duplexer according to claim 17, wherein the surface acoustic wave device further comprises:
a third conductor layer between the first conductor layer and the second conductor layer; wherein
the third conductor layer includes one metal selected from a group consisting of Pt, Au, Ag, Ta, W, Ni and Mo or a metal alloy including at least two of Pt, Au, Ag, Ta, W, Ni and Mo.

21. The duplexer according to claim 15, further comprising:
an insulating layer that covers the IDT electrode.

* * * * *